US009434878B2

United States Patent
Chuang et al.

(10) Patent No.: US 9,434,878 B2
(45) Date of Patent: Sep. 6, 2016

(54) PHOSPHOR, PREPARING METHOD FOR PHOSPHOR, AND LIGHT EMITTING DEVICE

(71) Applicant: Chi Mei Corporation, Tainan (TW)

(72) Inventors: Yao-Tsung Chuang, Tainan (TW); Jen-Shrong Uen, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/521,530

(22) Filed: Oct. 23, 2014

(65) Prior Publication Data

US 2015/0184072 A1  Jul. 2, 2015

(30) Foreign Application Priority Data

Dec. 26, 2013  (TW) .............................. 102148454 A

(51) Int. Cl.
| | |
|---|---|
| *H01L 33/00* | (2010.01) |
| *C09K 11/08* | (2006.01) |
| *C09K 11/66* | (2006.01) |
| *C09K 11/77* | (2006.01) |
| *H01L 33/50* | (2010.01) |

(52) U.S. Cl.
CPC ......... *C09K 11/7774* (2013.01); *H01L 33/502* (2013.01); *H01L 2224/48091* (2013.01); *H01L 2224/48247* (2013.01); *H01L 2224/8592* (2013.01)

(58) Field of Classification Search
None
See application file for complete search history.

(56) References Cited

U.S. PATENT DOCUMENTS

| | | | |
|---|---|---|---|
| 8,377,335 B2 | 2/2013 | Fukuta et al. | |
| 8,414,796 B2 | 4/2013 | Tao et al. | |
| 9,133,392 B2 | 9/2015 | Raukas et al. | |
| 2008/0217636 A1* | 9/2008 | Bechtel | H01L 33/505 257/98 |
| 2010/0200874 A1* | 8/2010 | Shioi | C09K 11/0883 257/91 |
| 2012/0080999 A1* | 4/2012 | Juang | C09K 11/0883 313/484 |
| 2012/0091879 A1* | 4/2012 | Juang | C09K 11/0883 313/483 |
| 2013/0134865 A1 | 5/2013 | Chuang et al. | |

FOREIGN PATENT DOCUMENTS

| | | |
|---|---|---|
| JP | 0641527 A | 2/1994 |
| JP | 20058844 | 1/2005 |
| JP | 200850493 | 3/2008 |
| TW | 201120184 A | 6/2011 |
| TW | 201321474 A1 | 6/2013 |
| WO | 2010095737 A1 | 8/2010 |

OTHER PUBLICATIONS

TW Office Action dated Dec. 24, 2014 (TWA102148454).
TW Office Action dated Dec. 24, 2014 (TWA102148451).
(Continued)

*Primary Examiner* — Calvin Choi
(74) *Attorney, Agent, or Firm* — McClure, Qualey & Rodack, LLP

(57) ABSTRACT

A phosphor, a preparing method for the phosphor, and a light emitting device are provided. The phosphor has a formula of $A_{3-x}Ce_xQ_5O_{12}$. A and Q are independently comprise Al, Ga, In, Sc, Y, La, Gd, Tb, Lu elements or combinations thereof. Ce represents a cerium element. O represents an oxygen element. $0<x\leq 3$. The phosphor contains 100 ppm~2000 ppm of Ba element.

17 Claims, 1 Drawing Sheet

(56) References Cited

OTHER PUBLICATIONS

English Abstract translation of TW201120184 (Published Jun. 6, 2011).

English Abstract translation of JP20058844 (Published Jan. 13, 2005).

English Abstract translation of JP200850493 (Published Mar. 6, 2008).

JPO Office Action dated Jan. 5, 2016 in corresponding JP application (No. JP2014-259706).

JPO Office Action dated Jan. 5, 2016 in corresponding JP application (No. JP2014-259707).

* cited by examiner

PHOSPHOR, PREPARING METHOD FOR PHOSPHOR, AND LIGHT EMITTING DEVICE

This application claims the benefit of Taiwan Patent Application No. 102148454, filed Dec. 26, 2013, the subject matter of which is incorporated herein by reference.

BACKGROUND

1. Technical Field

The disclosure relates in general to a phosphor and a preparing method for the same, and particularly to a phosphor containing Si/Ba element and a light emitting device using the same.

2. Description of the Related Art

In recent years, light emitting devices utilizing semiconductors for emitting lights have been intensively used. In particular, light emitting diodes (LED) have been developed successfully. Compared to conventional light emitting equipment, such as cold cathode fluorescent lamps and incandescent lamps, light emitting devices utilizing light emitting diodes have advantages of high emitting efficiency, small volumes, low power consumption, and low cost. Therefore, such light emitting devices are used in various light sources. Semiconductor light emitting devices comprise semiconductor light emitting elements and fluorescent materials. Fluorescent materials can absorb and convert lights emitted from semiconductor light emitting elements. Lights emitted directly from semiconductor light emitting elements and lights converted by fluorescent materials can be mixed for use. Such light emitting devices can be used in various areas, such as fluorescent lights, car lighting, display devices, and liquid crystal backlights.

Current white LED light emitting devices are developed according to anaglyphic principle. Fluorescent materials absorb a blue light emitted from semiconductor light emitting elements and convert it into a yellow light. When the blue light and the yellow light enter human eyes simultaneously, a white light is observed by the human. For example, the above-mentioned effect can be achieved via a semiconductor of InGaN and a yellow fluorescent material having a general formula of $(Y,Gd)_3(Al,Ga)_5O_{12}$:Ce.

Further, a white light can be generated by utilizing a combination of a light emitting element which emits ultraviolet lights and a fluorescent material which emits g RGB (red, green, and blue) lights. Furthermore, when a light emitting element emits an ultraviolet light, the ultraviolet light is converted by a fluorescent material to emit a blue light, and then another fluorescent material is excited by the blue light to emit a yellow light, as such, a white light is generated by mixing the blue light and the yellow light.

However, light emitting devices have been used in more and more areas, and the brightness of the commercially yellow fluorescent material $(Y,Gd)_3(Al,Ga)_5O_{12}$:Ce series is evidently insufficient, therefore, the industrial needs are not satisfied. In addition, when brightness is increased, luminescent chromaticity shift easily occurs. Therefore, developing a fluorescent material which satisfies the needs for various applications of light emitting devices as well as increases luminance has become one of the most important goals.

SUMMARY

The present disclosure relates to a phosphor and a light emitting device using a semiconductor light emitting element with the phosphor and having an excellent light emitting characteristic such as high brightness.

According to an embodiment of the present disclosure, a phosphor is disclosed. The phosphor comprises a formula of $A_{3-x}Ce_xQ_5O_{12}$. The A and the Q independently comprise aluminum (Al), gallium (Ga), indium (In), scandium (Sc), yttrium (Y), lanthanun (La), gadolinium (Gd), terbium (Tb), lutetium (Lu), or a combination thereof. Ce is cerium. O is oxygen. $0<x\leq3$. The phosphor contains 100 ppm~2000 ppm of barium (Ba).

According to another embodiment of the present disclosure, a phosphor is disclosed. The phosphor comprises a formula of $A_{3-x}Ce_xQ_5O_{12}$. The A and the Q independently comprise aluminum (Al), gallium (Ga), indium (In), scandium (Sc), yttrium (Y), lanthanun (La), gadolinium (Gd), terbium (Tb), lutetium (Lu), or a combination thereof. Ce is cerium. O is oxygen. $0<x\leq3$. The phosphor contains 200 ppm~800 ppm of silicon (Si).

According to yet another embodiment of the present disclosure, a light emitting device is disclosed. The light emitting device comprises a semiconductor light emitting element and the above said phosphor. The phosphor is excited by a light emitted from the semiconductor light emitting element and converts the light emitted from the semiconductor light emitting element to emit a light having a wavelength different from a wavelength of light emitted from the semiconductor light emitting element.

According to another embodiment of the present disclosure, a preparing method for a phosphor is disclosed. The method comprises following steps. A raw material mixture is sintered to obtain a sintered phosphor material. The sintered phosphor material is mixed with an alkali metal silicate aqueous solution to obtain a phosphor mixture. Then the phosphor mixture is subjected a subsequent treating process comprising a water-washing step to obtain the phosphor.

The above and other embodiments of the disclosure will become better understood with regard to the following detailed description of the non-limiting embodiment(s). The following description is made with reference to the accompanying drawings.

DETAILED DESCRIPTION

Figure 1:
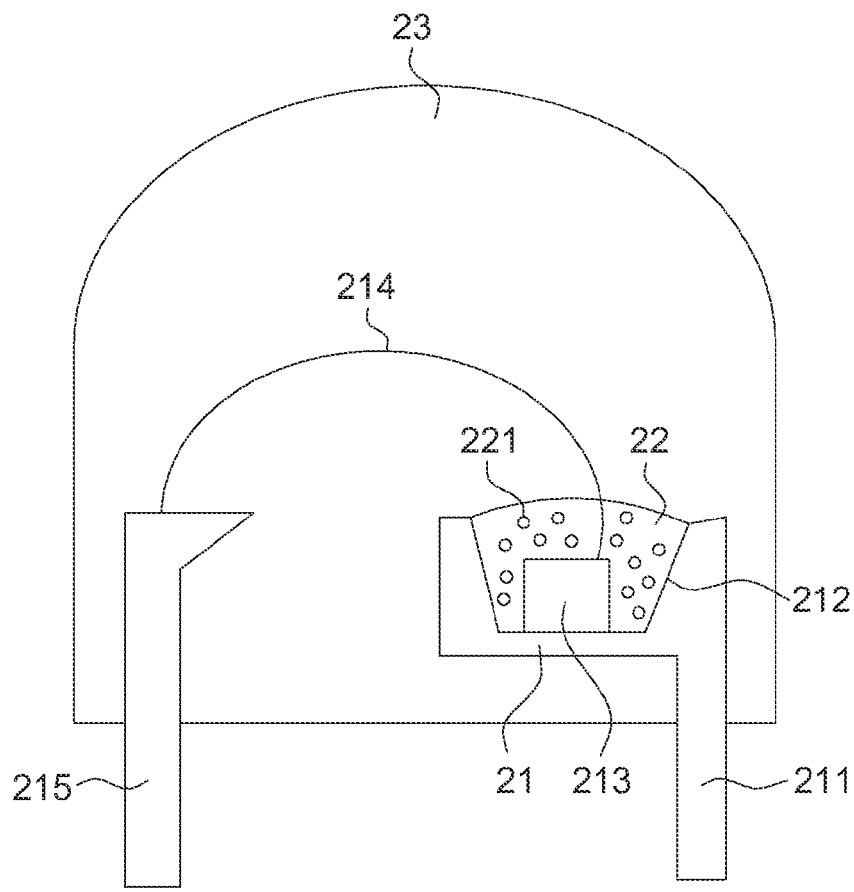
FIG. 1 shows a cross-sectional view of the light emitting device according to an embodiment of the present disclosure.

In embodiments, the phosphor comprises a composition having a formula of $A_{3-x}Ce_xQ_5O_{12}$. Ce is an element cerium. O is an element oxygen. In embodiments, the phosphor contains 100 ppm~2000 ppm of an element Barium (Ba), preferably 200 ppm~1800 ppm of Ba, and more preferably 300 ppm~1700 ppm of Ba. In one embodiment, the phosphor contains 200 ppm~800 ppm of an element silicon (Si), preferably 300 ppm~700 ppm of Si, and more preferably 400 ppm~600 ppm of Si. The phosphor may have at least one of elements Ba and Si, or have both of the elements Ba and Si. The phosphor complying with the above conditions has a notable improved brightness. As compared with a phosphor not complying with the above conditions (comparative example), the phosphor of embodiment has a higher brightness.

The element A of the phosphor of $A_{3-x}Ce_xQ_5O_{12}$ may comprise aluminum (Al), gallium (Ga), indium (In), scandium (Sc), yttrium (Y), lanthanun (La), gadolinium (Gd), terbium (Tb), lutetium (Lu) elements, or a combination thereof. Preferably, the A comprises at least one of Y, Gd, Tb and Lu. In one embodiment, the A is Y element. Ce is cerium. O is oxygen.

$0<x\leq 3$. For example, $0.025\leq x\leq 1$.

In the phosphor of $A_{3-x}Ce_xQ_5O_{12}$, Q may comprise elements aluminum (Al), gallium (Ga), indium (In), scandium (Sc), yttrium (Y), lanthanum (La), gadolinium (Gd), lutetium (Lu), or combinations thereof. Preferably, Q comprises at least one of elements Al, Ga, In, and Sc. In one embodiment, Q is represented by a formula of $Al_yGa_{1-y}$, wherein $1\geq y>0$, or $1\geq y\geq 0.4$.

The phosphor can be excited by a light of wavelength 455 nm to emit a light having a dominant wavelength of 520~580 nm, and CIE chromaticity coordinates (x, y) of $0.360\leq x\leq 0.460$ and $0.530\leq y\leq 0.580$. The dominant wavelength is the wavelength of strongest intensity of the emitting light.

According to embodiments, the phosphor may be prepared by a method comprising following steps. Phosphor raw materials and a fluxing agent are mixed to obtain a raw material mixture. Next, the raw material mixture is subjected to a sintering step to form a sintered phosphor material. The formed sintered phosphor material may be grinded. Then, the sintered phosphor material (or grinded sintered phosphor material) and an alkali metal silicate aqueous solution are mixed to obtain a phosphor mixture. The phosphor mixture is subjected to a treating process that may comprise a grinding step, a water-washing step, and/or (then) a drying step to obtain the phosphor.

The phosphor raw material may comprise source materials for each of the elements of the composition $A_{3-x}Ce_xQ_5O_{12}$ of the phosphor, i.e. the source materials containing the cerium (Ce) element; the oxygen (O) element; and the elements aluminum (Al), gallium (Ga), indium (In), scandium (Sc), yttrium (Y), lanthanum (La), gadolinium (Gd), terbium (Tb), lutetium (Lu), or combinations thereof. The source materials may comprise an oxygen-containing compound, a nitrogen-containing compound, or other kinds of compound, or elemental substances, or combinations thereof. The oxygen-containing compound may comprise an oxide, a carbonate, an oxalate, or other compounds, which can be decomposed during the sintering process. Proportion of the source materials may be selected according to mole ratio of every element of the expected $A_{3-x}Ce_xQ_5O_{12}$ composition of the phosphor. In one embodiment, for example, the source material for A comprises $Y_2O_3$. The source material for the Ce element comprises $CeO_2$. The source material for Q comprises $Al_2O_3$ and/or $Ga_2O_3$. The source material for the O element may comprise oxygen element from the source material for the A, Ce, Q, elements etc., or oxygen element generated during the sintering step. However, the present disclosure is not limited thereto.

The fluxing agent may occupy 1.0 wt. %~3.0 wt. % of the raw material mixture. The fluxing agent may be a metal halide, for example comprising $NaF$, $KF$, $BaF_2$, $SrF_2$, $MgF_2$, $AlF_3$, $YF_3$, $NaCl$, $BaCl_2$, or a combination thereof. In one embodiment, the fluxing agent comprises $BaF_2$.

The raw materials may be commercial products, and preferably have high purity for decreasing impurity that may affect brightness of the phosphor powder products, such as higher than 2N (99%), preferably higher than 3N (99.9%).

Preferably, a particle size of each of the raw materials is designed to be micro size based on promoting reaction.

The phosphor raw materials and the fluxing agent may be mixed together by a method comprising a dry process (such as dry ball milling) or a wet process (such as wet ball milling) and not restricted to a single type of process. The weighing, mixing steps, etc. may be performed in a glove box under an inactive or dewatered environment. In addition, a proper organic solvent, such as pure water or an organic solvent, etc., may be used according to characteristics of the materials for the wet mixing method. A mixer device may use a ball mill, a mortar, or other common devices.

In the preparing method, the sintering step may be performed under an ambient atmospheric pressure or a condition compressed by gas, or other conditions without an external mechanical pressure. The high temperature furnace for the sintering can use a metal resistive heating type or a graphite resistive heating type preferably since a sintering temperature is high.

In the sintering step, a crucible for placing the raw material mixture therein preferably has a material of high degree of purity, that is, having an impurity of extreme small amount, such as a $Al_2O_3$ crucible, a $Si_3N_4$ crucible, a AlN crucible, a Sialon crucible, a boron nitride (BN) crucible, or other crucibles suitable for using in an inactive environment, in which the BN crucible is preferably since it can provide a good effect preventing an impurity of which from mixing into the materials. The crucible can be aluminum oxide, boron nitride, or graphite, and the materials chosen for the crucible is not limited to the materials aforementioned. A cover layer on an inner wall of the crucible may be formed by various materials during a high temperature sintering process. For example, one of the raw materials of the to-be-sintered raw material mixture or a mixture of the raw materials can be used for forming the cover layer by the sintering step. The sintering condition for the cover layer can be 850° C.~1500° C. and 0.5~10 hours. When the sintering temperature is too low or the sintering time duration is too short, the effective cover layer may not be formed successfully. When the sintering time duration is too long or the sintering temperature is too high, economic benefit is not achieved. The cover layer can prevent impurities, such as Si and Ca, from being released and being entering the sintered phosphor material under a high temperature, hence influencing the property of the phosphor. The sintering atmosphere may be a non-oxidizing gas, such as nitrogen, hydrogen, ammonia, argon, or an arbitrary combination of the above-mentioned gases.

The sintering temperature is 1000° C.~1500° C., preferably 1200° C. ~1500° C. The heating rate is 5~15° C./min. The sintered phosphor material can be prepared as having a smaller particle size by using a lower sintering temperature, or having a larger particle size by using a higher sintering temperature. The sintering time may be controlled according to types of the raw materials, usually 1~12 hours, preferably 1.5~5 hours. A sintering pressure of the inactive environment may be, for example, equal to or lower than 0.5 MPa, particularly equal to or lower than 0.1 MPa preferably.

After the sintering step, the sintered phosphor material may be further cooled to a room temperature, pulverized by using the ball mill or a pulverizer, etc.

The sintered phosphor material may be mixed with the alkali metal silicate aqueous solution by a ball mill or other suitable grinding methods. An added weight of the alkali metal silicate aqueous solution is 0.8%~1.5% of a total weight of the sintered phosphor material. The alkali metal silicate aqueous solution may comprise a water glass-water solution. The water glass is a water soluble material formed by an alkali metal oxide and silicon dioxide. According to types of the alkali metal, the water glass comprises a sodium water glass having a molecular formula of $Na_2O \cdot nSiO_2$, and a potassium water glass having a molecular formula of $K_2O \cdot nSiO_2$. The coefficient of n in the molecular formula is referred to as water glass modulus, indicating a molecular ratio (or mole ratio) of the silicon oxide and the alkali metal oxide in the water glass. n may be 1.5~4.0, preferably 2.0~3.5.

The subsequent treating process for obtaining the phosphor comprises subjecting a phosphor mixture which is formed by mixing the sintered phosphor material and the alkali metal silicate aqueous solution to a subsequent treating process that may comprise a water-washing step, a filtering step, and/or a drying step, or other steps such as a classing step, performed once or more times. In embodiments, the subsequent treating process, like the water-washing step, can decreasing (or removing) impurities and improving light emitting characteristics of the phosphor.

In the subsequent treating process, impurities that would affect brightness of the phosphor should be controlled as low as possible. For example, elements boron, chlorine, carbon, etc. may be less than 1000 ppm, respectively.

Results from constituent analysis have found a slight deviation between the mole numbers (i.e. 3−x, x, 5, 12, y, 1−y) of each of the elements of the $A_{3-x}Ce_xQ_5O_{12}$ composition (or $Al_yGa_{1-y}$) for the phosphor and the raw materials. It is assumed that the result is due to decomposition or evaporation of small quantity of the raw materials during the sintering, or analytical inaccuracy. In particular, it is supposed that deviations in the value for the oxygen element is due to oxygen contained in the initial raw materials or adsorbed to the surfaces of the raw materials, or surface oxidation of the raw materials during weighing, mixing and sintering steps, or moisture, oxygen, etc., adsorbed to the surface of the sintered phosphor material (or phosphor) after the sintering. In addition, when the sintering step is performed in an environment containing nitrogen and/or ammonia gas, the oxygen contained in the raw materials might possibly separate therefrom and be replaced by a nitrogen element, and thus the slight deviations in the oxygen value of the phosphor would occur.

As the phosphor is used in a form of powders, an average particle diameter is smaller than 30 μm preferably. It is because the emitting light mainly occurs on the particle surface of the phosphor. If the average particle diameter, which means a volumetric median particle diameter (D50) in the application, is smaller than 30 μm, the surface area per weight unite of the powders can be assured for avoiding decreasing the brightness. In addition, the density of the powders coated onto the light emitting element can be increased also for avoiding decreasing the brightness for the device. Furthermore, the average particle diameter of the phosphor powders should be larger than 1 μm preferably for good light emitting efficiency. Accordingly, the average particle diameter of the phosphor of powders should be preferably larger than 1 μm and smaller than 30 μm, and more preferably larger than 3.0 μm and smaller than 20 μm. The term "average particle diameter (D50)" in the present application is a value measured by Coulter method (volumetric median particle diameter D50) using the MultiSizer-3 of Beckman Coulter Company.

The phosphor of the present invention is applicable to vacuum fluorescent displays (VFD), field emission displays (FED), plasma display panels (PDP), cathode ray tubes (CRT), light emitting diodes (LED), and etc. Particularly, when the phosphor is excited by a light having a wavelength of 455 nm, an emitting light from the excited phosphor has a main wavelength of 520 nm-580 nm and CIE 1931 chromaticity coordinates (x,y) of $0.360 \leq x \leq 0.460$ and $0.530 \leq y \leq 0.580$, and has high brightness, thus the phosphor is suitable for the light emitting diodes.

In an embodiment, a light emitting device includes a light emitting element and the phosphor described above. The phosphor is excited by a light emitted from the light emitting element and converts the light emitted from the light emitting element to emit a light having a wavelength different from the wavelength of the exciting light.

The light emitting element may be a semiconductor light emitting element, such as semiconductors comprising zinc sulfide, gallium nitride, etc. In view of illumination efficiency, using a semiconductor of gallium nitride is preferable. The light emitting element is prepared by forming a nitride semiconductor on a substrate by a metal organic chemical vapor deposition (MOCVD) or a hydride vapor phase epitaxy (HVPE). The light emitting element made of $In_\alpha Al_\beta Ga_{1-\alpha-\beta}N$ ($0 \leq \alpha$, $0 \leq \beta$, $\alpha+\beta<1$) is the most preferable. The semiconductor structure may be a homogeneous structure, such as metal-insulator semiconductor (MIS), PIN linkage, and PN linkage, a heterojunction structure, or a double heterojunction structure. The wavelength of the emitting light may be decided according to the materials of the semiconductor layer or the mixed crystal level. Preferably, the light emitted from the light emitting element of the light emitting device is 300 nm~550 nm, and more preferably 330~500 nm. The phosphor according to the embodiments of the invention can be mixed with a transparent material to form a wavelength conversion material. The transparent material may be epoxy, silicone resin, glass, thermoplastics, and etc., which lights can pass through. The wavelength conversion material comprises at least a single layer wavelength conversion material formed with the phosphor or a laminated multilayer wavelength conversion material formed with the phosphor. The wavelength conversion material is disposed on the illumination path on the semiconductor light emitting element. For example, the wavelength conversion material is coated directly on the surface of the light emitting element, the wavelength conversion material is made into a mold which covers the light emitting element as an encapsulation, the wavelength conversion material is formed on the surface of an encapsulation, or the wavelength conversion material is formed on an optical plate or an optical film and arranged in front of the projecting side of the LED light.

FIG. 1 shows a cross-sectional view of the light emitting device according to an embodiment of the present disclosure. The light emitting device comprises a light emitting unit 21, a phosphor layer 22, and an encapsulating layer 23.

The light emitting unit 21 comprises a conductive base 211 having a concave bearing surface 212, a light emitting element 213 disposed in the concave bearing surface 212 and electrically connected to the base 211, a connecting wire 214 electrically connected to the light emitting element 213, a conducting wire 215 electrically connected to the connecting wire 214. The base 211 and the conducting wire 215 can cooperate to supply external electrical energy to the light emitting element 213. The light emitting element 213 can convert the electrical energy to light energy and emit it out. An example of the invention is to adhere a commercial available InGaN light emitting element 213 (Chi Mei Lighting Technology Corp.) of light emitting wavelength of 455 nm on the concave bearing surface 212 of the base 211 with a conductive silver paste (BQ6886, Uninwell International), and then the connecting wire 214 electrically connected to the light emitting element 213 and the conducting wire 215 are extended from the top surface of the light emitting element 213.

The phosphor layer 22 covers the light emitting element 213. After the phosphor 221 contained in the phosphor layer 22 are excited by the light emitted from the light emitting element 213, the phosphor 221 converts the light emitted from the light emitting element 213 to emit a light having a wavelength different from the wavelength of the exciting light. In the example, the phosphor layer 22 is formed by coating a polysiloxane resin with the phosphor 221 contained therein on the external surface of the light emitting element 213 followed by drying and hardening.

The encapsulating layer 23 covers a part of the base 211 of the light emitting unit 21, connecting wire 214, a part of the conducting wire 215, and the phosphor layer 22.

In the light emitting device of the invention, the phosphor of the invention can either be used independently or by cooperating with a phosphor of other light emitting characteristics, such that a light emitting device capable of emitting desired colors of light is constructed.

For example, a blue light emitting element of 420 nm~500 nm, red phosphor emitting light of 600 nm~650 nm (such as $CaAlSiN_3$:Eu), and the phosphor for emitting yellow light of the invention are assembled to manufacture a light emitting device. Red light and yellow light will be emitted respectively when the phosphor is illuminated by the blue light emitted from the light emitting element, and the lights will be mixed with the blue light emitted from the light emitting element to become a white light emitting device (such as a light apparatus, a light emitting diode, and etc.)

EXPERIMENTAL EXAMPLE

Figure 2:
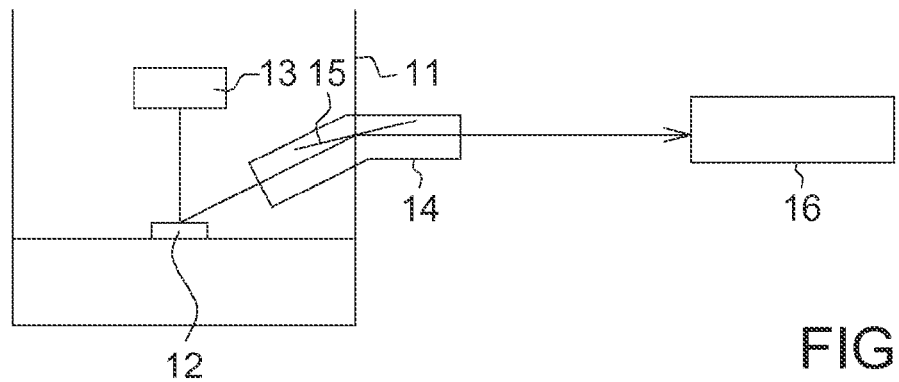
FIG. 2 shows the measurement apparatus of the characteristics of the light emitted from the phosphor.

Experimental examples are illustrated as following.
Measurement Methods:
Luminescence Spectrum of the Phosphor:
The measurement apparatus of the characteristics of the light emitted from the phosphor is as shown in FIG. 2. The measurement is carried out as follows. 1.8 grams of sample was taken into a sample holder 12 having a diameter of 12 cm and pressed so that the sample is uniformly distributed in the sample holder 12. The sample holder 12 was then placed inside a black box body 11. A light source 13 of wavelength of 455 nm, such as an InGaN blue light emitting diode element having a silicon carbide substrate, was disposed vertically above the sample with a distance of 5 cm away from the sample. The sample was irradiated with the light source 13. The fluorescent light was directed horizontally into a brightness meter 16 (TOPCON, SR-3A) via a reflective mirror 15. The reflective mirror 15 was disposed in a light guide tube 14 having a diameter of 2 cm and directed the fluorescent light emitted from the fluorescent material. The light guide tube 14 and the light source formed an angle of 45°. The distance between the reflective mirror 15 and the sample holder 12 was 8 cm, and the distance between the brightness meter 16 and the reflective mirror 15 was 40 cm. The brightness meter 16 applied a field 1° detection mode. Measurement inaccuracy in brightness value was within ±0.3%. Main wavelength of light from the phosphor was measured by Fluoro Max-3 of Jobin YVON.

Composition Element Analysis of Phosphor(s):
(3-1a) Instrument: The measurement was carried out with inductively coupled plasma atomic emission spectrometer (ICP) (ULTIMA-2 type, Jobin Yvon Technology).

(3-1b) Pretreatments of sample(s): A sample of 0.1 gram was accurately weighed and taken to place in a platinum crucible. 1 gram of $Na_2CO_3$ was added into the platinum crucible, and mixed with the sample uniformly. Then, the mixture was fused by a high temperature furnace in 1200° C. (temperature condition: temperature was raised from the room temperature to 1200° C. in 2 hours and stayed at 1200° C. for 5 hours). The fusion product was then cooled and added into an acid solution, such as 25 ml HCl (36%), and then heated to be dissolved until the solution was clear. The solution was then placed into a 100 mL PFA volumetric flask after being cooled and quantitatively added with pure water to the marked line of the flask.

(3-2a) Instrument: Nitrogen and Oxygen analyzer (Horiba Ltd., EMGA-620W).

(3-2b) Measurement: 20 mg of the phosphor was placed into a Sn capsule, and then the capsule was placed in a crucible to be measured.

EMBODIMENT AND COMPARATIVE EXAMPLE

The preparing methods for the phosphors in embodiments and comparative examples are similar, but different as shown in table 1 in: the ration of the elements for the composition formula $A_{3-x}Ce_xQ_5O_{12}$; quantity of the fluxing agent; quantity of the water glass-water solution; a time number for the ball milling (or water-washing step). The preparing method of the phosphor in Embodiment 5 is disclosed as the following as an example.

In Embodiment 5, the raw materials of $Y_2O_3$ (Sigma-Aldrich, 4N), $Al_2O_3$ (Sasol North America Pural BT, 4N), $Ga_2O_3$ (Sigma-Aldrich, 4N), $CeO_2$ (Shanghai Yuelong Rare Earth New Materials Co., Ltd., 4N), and $BaF_2$ (Sigma-Aldrich, 4N) were prepared. The raw materials with the mole relation of $Y_2O_3$:$Al_2O_3$:$Ga_2O_3$:$CeO_2$:$BaF_2$=0.297:0.365:0.135:0.003:0.013 were mixed uniformly to obtain the raw material mixture of 200 g. The raw material mixture put in the crucible was sintered in an atmosphere environment of the nitrogen gas volume: the hydrogen gas volume=95%:5% in the high temperature furnace by increasing the temperature slowly from the room temperature and maintain 1500° C. for 4 hours, and then cooling down to the temperature slowly. The sintered phosphor material obtained by the sintering were pulverized and then ball mill grinding. The ratio between phosphor and water glass-water solution is 100 g phosphor to 100 ml water glass-water solution. The water glass-water solution is 2 wt %(mole ratio $SiO_2$/$Na_2O$=3.4~4) and the solution is mixed by the ball milling method with the phosphor, and then washed by water twice, filed, dried, etc., to obtain the phosphor. The mentioned 2 wt % water glass-water solution was prepared by mixing 28 wt % water glass-water solution (purchased from wako chemical) with water.

The phosphor of Embodiment 5 is measured by the oxygen/nitrogen analyzer and the ICP analysis to have the formula $(Y_{2.965},Ce_{0.035})(Al_{3.65},Ga_{1.35})O_{12}$, i.e. the formula $A_{3-x}(Ce_xQ_5O_{12}$ in which A is element yttrium (Y), x=0.035, Q is the formula $Al_yGa_{1-y}$, y=3.65/5=0.73. The phosphor contains 422.5 ppm of Si, and 1352.5 ppm of Ba. The dominant wavelength of the emitting light is 540 nm.

TABLE 1

| Experimental Example | composition x | composition y | water glass-water solution) (wt %) | BaF$_2$ (wt %) | number of times for ball milling |
|---|---|---|---|---|---|
| Comparative example 1 | 0.035 | 0.73 | — | 1.74 | 2 |
| Comparative example 2 | | | | | 5 |
| Comparative example 3 | | | 1.00 | 1.74 | 0 |
| Embodiment 4 | | | | | 1 |
| Embodiment 5 | | | | | 2 |
| Embodiment 6 | | | | | 3 |
| Embodiment 7 | | | | | 4 |
| Comparative example 8 | | | | | 5 |
| Comparative example 9 | | | — | 0.87 | 0 |
| Comparative example 10 | | | | | 1 |
| Embodiment 11 | 0.055 | 0.87 | 1.30 | 1.55 | 1 |
| Embodiment 12 | | | | | 2 |
| Embodiment 13 | | | | | 4 |
| Embodiment 14 | 0.065 | 1 | 0.8 | 1.12 | 1 |
| Embodiment 15 | 0.055 | 0.6 | 1.20 | 1.38 | 2 |
| Embodiment 16 | 0.025 | 0.4 | 1.48 | 1.80 | 3 |
| Embodiment 17 | 0.1 | 0.53 | 1.13 | 3.00 | 4 |

In table 1, the quantity of the fluxing agent BaF$_2$ is measured based on the total quantity of the raw material mixture including Y$_2$O$_3$, Al$_2$O$_3$, Ga$_2$O$_3$, CeO$_2$ and BaF$_2$. The quantity of the water glass-water solution is measured based on the weight of the sintered phosphor material obtained by the sintering. The number of times for ball milling means the times for performing the treating step comprising the ball milling step, twice the water-washing step, the filtering step and the drying step, after the sintered phosphor material is mixed with the water glass-water solution. For example, 0 time means the sintered phosphor material mixed with the water glass-water solution is not subjected to the ball milling step and the water-washing step, and is subjected to the drying step. 2 times means the sintered phosphor material mixed with the water glass-water solution is subjected to one the treating step comprising the once ball milling step, the twice water-washing steps, the filtering step and the drying step, and then is subjected to another the treating step comprising the once ball milling step, the twice water-washing steps. The rest can be done in the same manner. Therefore, the more time number for ball milling in table 1 means more washing times by water.

The composition column in table 1 shows that the phosphors of Comparative example 1 to Embodiment 10 have the composition (Y$_{2.965}$,Ce$_{0.035}$)(Al$_{3.65}$,Ga$_{1.35}$)O$_{12}$; Embodiments 11 to 13 have the composition (Y$_{2.945}$,Ce$_{0.055}$)(Al$_{4.35}$, Ga$_{0.65}$)O$_{12}$; Embodiment 14 has the composition (Y$_{2.945}$, Ce$_{0.065}$)(Al$_{5.00}$)O$_{12}$; Embodiment 15 has the composition (Y$_{2.945}$,Ce$_{0.055}$)(Al$_{3.00}$,Ga$_{2.00}$)O$_{12}$; Embodiment 16 has the composition (Y$_{2.975}$,Ce$_{0.025}$)(Al$_{2.00}$,Ga$_{3.00}$)O$_{12}$; Embodiment 17 has the composition (Y$_{2.900}$,Ce$_{0.100}$)(Al$_{2.65}$,Ga$_{2.35}$)O$_{12}$.

Table 2 list the Si, Ba, Li quantities and the brightness of the phosphor. The brightness uses embodiments as a standard of 100%.

TABLE 2

| Experimental Example | Si (ppm) | Ba (ppm) | Li (ppm) | brightness (%) |
|---|---|---|---|---|
| Comparative example 1 | 55.9 | 2825.4 | 21.6 | 96 |
| Comparative example 2 | 53.2 | 2801.8 | 20.4 | 95 |
| Comparative example 3 | 1153.8 | 2874.2 | 23.6 | 95 |
| Embodiment 4 | 746.2 | 1945.8 | 21.1 | 100 |
| Embodiment 5 | 422.5 | 1352.5 | 20.8 | 100 |
| Embodiment 6 | 294.6 | 688.3 | 20.2 | 100 |
| Embodiment 7 | 205.4 | 252.1 | 19.4 | 100 |
| Comparative example 8 | 117.3 | 84.9 | 18.1 | 95 |
| Comparative example 9 | 56.5 | 1533.7 | 21.9 | 94 |
| Comparative example 10 | 56.0 | 1526.6 | 20.7 | 93 |
| Embodiment 11 | 788.5 | 1682.7 | 22.8 | 100 |
| Embodiment 12 | 538.9 | 1491.8 | 18.4 | 100 |
| Embodiment 13 | 314.4 | 159.9 | 17.8 | 100 |
| Embodiment 14 | 624.5 | 1607.8 | 18.6 | 100 |
| Embodiment 15 | 488.5 | 1185.3 | 22.9 | 100 |
| Embodiment 16 | 694.1 | 954.2 | 23.0 | 100 |
| Embodiment 17 | 355.8 | 1779.6 | 21.7 | 100 |

From table 1 and table 2, the results as the following are found.

The phosphor prepared without using the water glass-water solution (indicated by the symbol "-" in water glass-water solution column in table 1, for example Comparative example 9) still has a trace amount of element Si and element Li. It is supposed to be the impurities occurring during the preparing process.

From the results of Comparative examples 1~2 and 9~10 without using the water glass-water solution, it is found that the element Ba could not be removed from the phosphor powders simply by the water-washing step. Therefore, the brightness of Comparative examples is much weaker than the brightness of Embodiments 4 to 7.

Using the water glass-water solution in the subsequent treating process, included ball milling step, the water-washing step, the filtering step and the drying step, can help removing the Ba impurity from the phosphor surface. The phosphor has better brightness as the Ba content is decreased to 100 ppm~2000 ppm. Although using the water glass-water solution would increase the Si content, the phosphor has better brightness as the Si content is 200 ppm~800 ppm. In addition, according to the data in table 2, the removing ability of the water glass-water solution is selectiveness. For example, the removing ability for the Ba element is much better than that for the Li element, or it can be said none of the Li element is removed by the water glass-water solution.

The phosphors of embodiments having 100 ppm~2000 ppm of the Ba element, and/or 200 ppm~800 ppm of the Si element exhibit excellent brightness. It is noted that the brightness property of the phosphors would be weakened when the quantity is more or less than the said element content.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phosphor, comprising a formula of $A_{3-x}Ce_xQ_5O_{12}$, wherein the A and the Q independently comprise aluminum (Al), gallium (Ga), indium (In), scandium (Sc), yttrium (Y), lanthanun (La), gadolinium (Gd), terbium (Tb), lutetium (Lu), or a combination thereof, Ce is cerium, O is oxygen, $0<x\leq3$, and the phosphor contains 100 ppm~2000 ppm of barium (Ba).

2. The phosphor according to claim 1, wherein the phosphor contains 200 ppm~800 ppm of silicon (Si).

3. The phosphor according to claim 1, wherein the phosphor contains 200 ppm~1800 ppm of Ba.

4. The phosphor according to claim 1, wherein the phosphor contains 300 ppm~700 ppm of Si.

5. The phosphor according to claim 1, wherein A comprises at least one of elements Y, Gd, Tb and Lu.

6. The phosphor according to claim 1, wherein Q comprises at least one of elements Al, Ga, In and Sc.

7. The phosphor according to claim 1, wherein $1\geq x\geq0.025$.

8. The phosphor according to claim 1, wherein Q is $Al_yGa_{1-y}$, and $1\geq y\geq0.4$.

9. A light emitting device, comprising:
a semiconductor light emitting element; and
the phosphor according to claim 1, wherein the phosphor is excited by a light emitted from the semiconductor light emitting element and converts the light emitted from the semiconductor light emitting element to emit a light having a wavelength different from a wavelength of light emitted from the semiconductor light emitting element.

10. A preparing method for a phosphor according to claim 1, comprising:
sintering a raw material mixture to obtain a sintered phosphor material, mixing the sintered phosphor material with an alkali metal silicate aqueous solution to obtain a phosphor mixture, and then a subsequent treating process performing to the phosphor mixture to obtain the phosphor, wherein the subsequent treating process comprises a water-washing step.

11. A phosphor, comprising a formula of $A_{3-x}Ce_xQ_5O_{12}$, wherein the A and the Q independently comprise aluminum (Al), gallium (Ga), indium (In), scandium (Sc), yttrium (Y), lanthanun (La), gadolinium (Gd), terbium (Tb), lutetium (Lu), or a combination thereof, Ce is cerium, O is oxygen, $0<x\leq3$, and the phosphor contains 200 ppm~800 ppm of Si.

12. The phosphor according to claim 11, wherein the phosphor contains 300 ppm~700 ppm of Si.

13. The phosphor according to claim 11, wherein A comprises at least one of elements Y, Gd, Tb and Lu.

14. The phosphor according to claim 11, wherein Q comprises at least one of elements Al, Ga, In and Sc.

15. The phosphor according to claim 11, wherein $1\geq x\geq0.025$.

16. The phosphor according to claim 11, wherein Q is $Al_yGa_{1-y}$, and $1\geq y\geq0.4$.

17. A preparing method for a phosphor according to claim 11, comprising:
sintering a raw material mixture to obtain a sintered phosphor material, mixing the sintered phosphor material with an alkali metal silicate aqueous solution to obtain a phosphor mixture, and then a subsequent treating process performing to the phosphor mixture to obtain the phosphor, wherein the subsequent treating process comprises a water-washing step.

* * * * *